US009698027B2

(12) United States Patent
Fontana (10) Patent No.: US 9,698,027 B2
(45) Date of Patent: Jul. 4, 2017

(54) METHOD OF FABRICATING INTEGRATED CIRCUITS HAVING A RECESSED MOLDING PACKAGE AND CORRESPONDING PACKAGE

(71) Applicant: STMICROELECTRONICS S.r.l., Agrate Brianza (MB) (IT)

(72) Inventor: Fulvio Vittorio Fontana, Monza (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 15/076,754

(22) Filed: Mar. 22, 2016

(65) Prior Publication Data

US 2017/0040244 A1 Feb. 9, 2017

(30) Foreign Application Priority Data

Aug. 5, 2015 (IT) ........................ 102015000042115

(51) Int. Cl.
*H01L 21/00* (2006.01)
*H01L 23/495* (2006.01)
(Continued)

(52) U.S. Cl.
CPC ...... *H01L 21/4832* (2013.01); *H01L 21/4825* (2013.01); *H01L 21/4828* (2013.01); *H01L 21/565* (2013.01); *H01L 21/568* (2013.01); *H01L 23/3114* (2013.01); *H01L 23/4952* (2013.01); *H01L 23/49503* (2013.01); *H01L 23/49541* (2013.01); *H01L 23/49568* (2013.01);
(Continued)

(58) Field of Classification Search
CPC . H01L 24/17; H01L 21/4828; H01L 21/4825; H01L 23/4952; H01L 23/49541; H01L 23/49503; H01L 24/49; H01L 23/3107; H01L 23/49568; H01L 21/4832; H01L 21/568; H01L 23/3114; H01L 23/49582
See application file for complete search history.

(56) References Cited

U.S. PATENT DOCUMENTS

6,348,726 B1 * 2/2002 Bayan ................. H01L 23/3107
                                                    257/666
7,247,526 B1 * 7/2007 Fan ..................... H01L 21/4832
                                                    257/E23.124
(Continued)

*Primary Examiner* — Alonzo Chambliss
(74) *Attorney, Agent, or Firm* — Slater Matsil, LLP (57) ABSTRACT

A method may include providing an electrically conductive laminar base member having a die attachment portion and a lead frame portion, producing a distribution of holes opening at a front surface of the base member, attaching an integrated circuit onto the front surface of the base member at the attachment portion, and producing a wire bonding pattern between the integrated circuit and wire bonding locations on the front surface of the base member at the lead frame portion. An electrically insulating package molding compound may be molded onto the front surface of the base member so that the integrated circuit and the wire bonding pattern are embedded in the package molding compound which penetrates into the holes opening at the front surface of the base member. The base member may be selectively etched from its back surface to produce residual portions of the base member at the wire bonding locations.

22 Claims, 11 Drawing Sheets

(51) Int. Cl.
   *H05K 7/18* (2006.01)
   *H01L 21/48* (2006.01)
   *H01L 21/56* (2006.01)
   *H01L 23/31* (2006.01)

(52) U.S. Cl.
   CPC ............... *H01L 23/49582* (2013.01); *H01L 2224/48091* (2013.01); *H01L 2224/48247* (2013.01); *H01L 2924/181* (2013.01); *H01L 2924/1815* (2013.01)

(56) References Cited

U.S. PATENT DOCUMENTS

| | | | |
|---|---|---|---|
| 9,165,867 B1 * | 10/2015 | Cadag | H01L 23/49541 |
| 2005/0236701 A1 * | 10/2005 | Minamio | H01L 21/565 |
| | | | 257/676 |
| 2009/0085177 A1 * | 4/2009 | Pisigan | H01L 21/4832 |
| | | | 257/666 |
| 2009/0115040 A1 | 5/2009 | Camacho et al. | |
| 2011/0227211 A1 | 9/2011 | Camacho et al. | |
| 2012/0068318 A1 * | 3/2012 | Camacho | H01L 21/4832 |
| | | | 257/676 |
| 2012/0074547 A1 | 3/2012 | Do et al. | |
| 2012/0119342 A1 * | 5/2012 | Chang Chien | H01L 21/4832 |
| | | | 257/676 |
| 2012/0241947 A1 | 9/2012 | Camacho et al. | |

\* cited by examiner

METHOD OF FABRICATING INTEGRATED CIRCUITS HAVING A RECESSED MOLDING PACKAGE AND CORRESPONDING PACKAGE

TECHNICAL FIELD

This description relates to integrated circuits. More particularly, one or more embodiments may apply to integrated circuits with flat no-leads packages, such as QFN (quad-flat no-leads) packages, for example.

TECHNICAL BACKGROUND

Flat no-leads packages, such as quad-flat no-leads (QFN) and dual-flat no-leads (DFN) packages, enable electrical and mechanical connection of integrated circuits (ICs) to substrates such as printed circuit boards (PCBs). In various implementations, flat no-lead packages may include a thermal pad to improve heat transfer from the integrated circuit to the substrate (e.g., a PCB).

In this context, further improvements may be desirable in terms of, for example, reducing the cost of the lead frame (LF), achieving a flexible (e.g., "universal") LF design, and reducing development time.

SUMMARY

According to an example embodiment, a method of producing an integrated circuit may include providing an electrically conductive laminar base member with opposing front and back surfaces. The base member may have a die attachment portion and a lead frame portion. The method may also include producing at the lead frame portion of the base member a distribution of holes, with the holes opening at the front surface of the base member, and attaching an integrated circuit onto the front surface of the base member at the die attachment portion. The method may further include producing a wire bonding pattern between the integrated circuit and wire bonding locations on the front surface of the base member at the lead frame portion, and molding an electrically insulating package molding compound onto the front surface of the base member, whereby the integrated circuit and the wire bonding pattern are embedded in the package molding compound with the package molding compound penetrating into the holes opening at the front surface of the base member. The base member may be selectively etched from the back surface thereof to produce residual portions of the base member at the wire bonding locations, with the residual portions being surrounded by columnar formations formed by the package molding compound penetrating into the holes in the distribution of holes.

A related integrated circuit may include a package of an electrically insulating molding compound embedding an integrated circuit and a wire bonding pattern extending between the integrated circuit and a set of wire bonding locations in a lead frame portion of an electrically conductive base member. The package of electrically insulating molding compound may include columnar formations surrounding the wire bonding locations of the lead frame portion.

BRIEF DESCRIPTION OF THE DRAWINGS

Various embodiments will now be described, by way of example only, with reference to the drawings, in which.

It will be appreciated that, for clarity of illustration, the various figures may not be drawn to the same scale.

DETAILED DESCRIPTION

In the following description specific features are presented to provide an in-depth understanding of example embodiments. However, in different embodiments one or more of such features may be omitted, or used with other methods, components, materials, etc. Certain known structures, materials, or operations are not illustrated or described in detail so as not to obscure other aspects of the embodiments.

Reference to "an embodiment" or "one embodiment" in the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular formations, structures, or characteristics may be combined in any suitable way in one or more embodiments.

The references used herein are provided merely for convenience and hence do not define the scope of protection or the scope of the embodiments.

Figure 1:
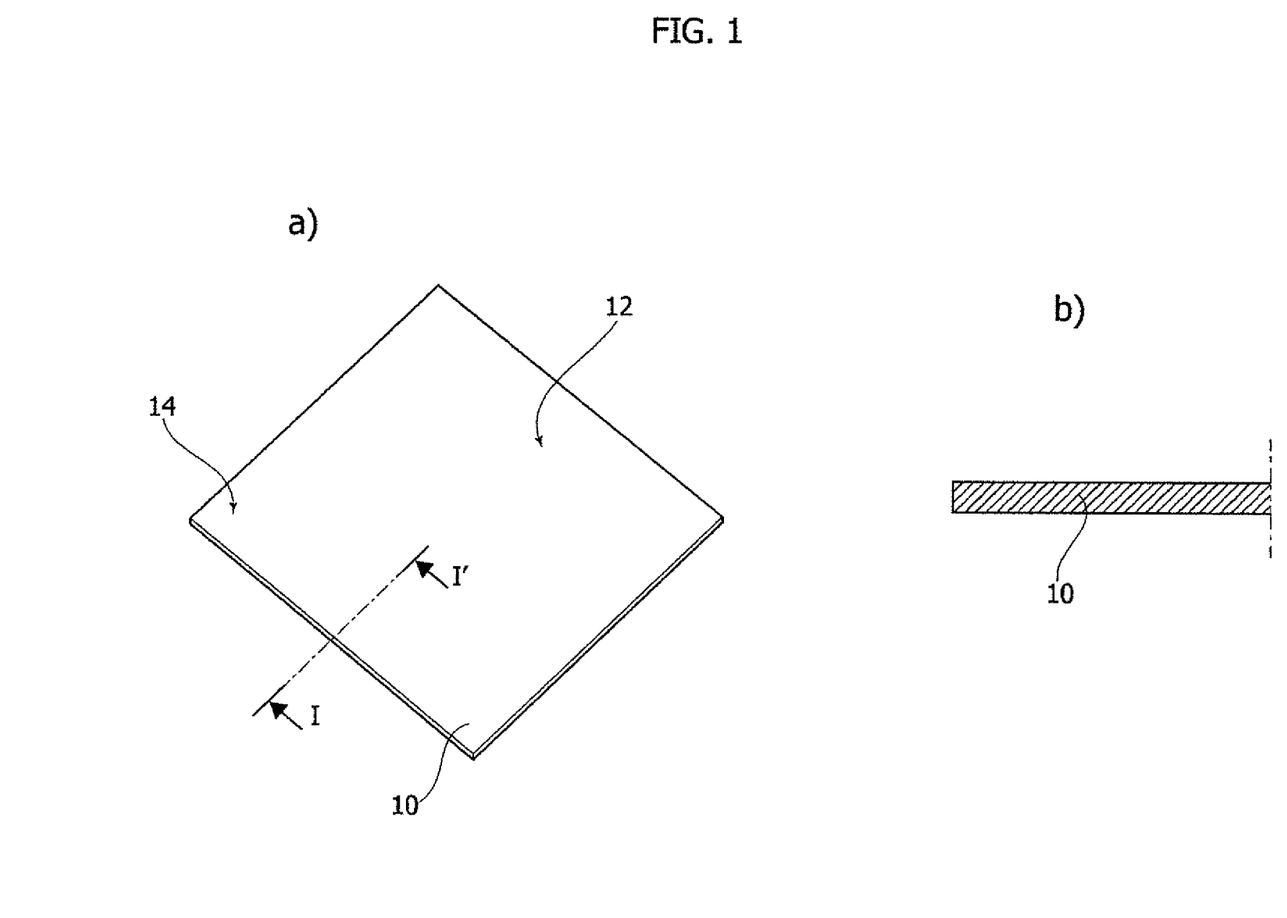
FIGS. 1-12 are a series of views illustrating a method of making a semiconductor device in accordance with an example embodiment, in which the portion a) is a perspective view, the portion b) is a corresponding cross-sectional view taken along the associated line (i.e., I-I', II-II', etc.) in portion a), and the portion c) shown in FIGS. 5, 10, 11 and 12 is an enlarged view of a region respectively designated by arrows C, C', C", C'" in the corresponding portion a).

Steps in a method according to an example embodiment will now be described with reference to FIGS. 1 to 12. In FIG. 1, an electrically conductive laminar base member 10 may include an electrically conductive material such as copper, for example. A copper sheet with a roughness SA 1.6-1.8 and a thickness 0.1-0.15 mm is exemplary of a laminar base member 10 which may be used in one embodiment of a method of producing integrated circuits with a flat no-leads package (e.g. a QFN package).

In the illustrated example, the base member 10 may have a parallelogram (e.g., square or rectangular) shape. However, in other embodiments, the base member 10 may have a different shape (e.g., a round shape). A die attachment portion 12 may be defined within the base member 10 (e.g., in a central portion of the member 10) for attaching an integrated circuit (die) along with a lead frame portion 14 (e.g., peripheral).

Figure 2:
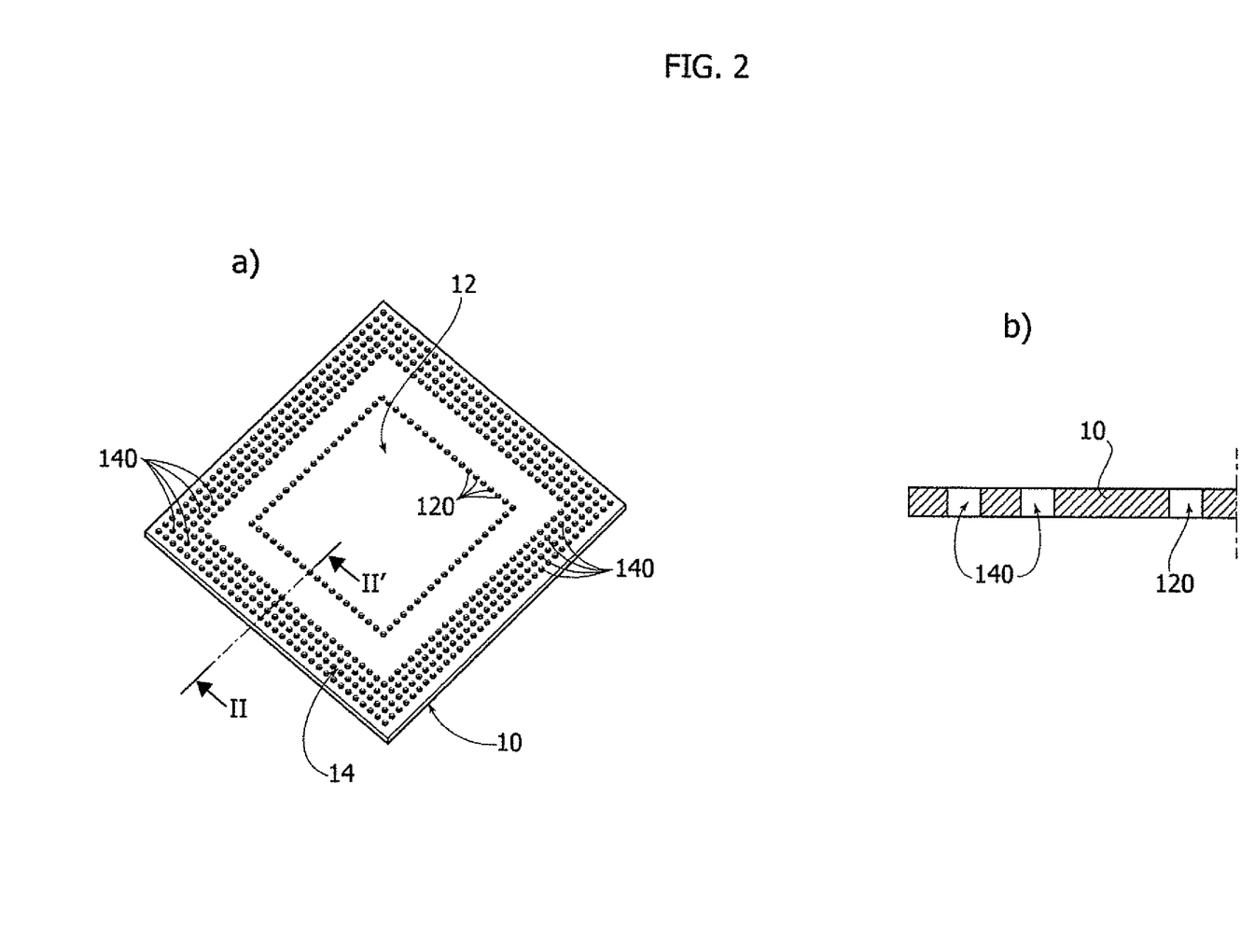

In FIG. 2, the lead frame portion 14 of the base member 10 is produced by forming a distribution (e.g., a square or rectangular "frame" extending peripherally around the base member 10) of holes 140 opening at a front surface of the base member 10 (in an upper position as shown, for example, in FIGS. 1 and 2). The holes 140 may be through holes, for example, i.e., holes which also open at the back surface of the base member 10 (in a lower position as shown, for example, in FIGS. 1 and 2).

By way of example, the holes 140 may have a diameter of approximately 0.1 mm. In one example embodiment, the separation "pitch" between adjacent holes 140 may be approximately 0.2 mm. Technologies which may be for producing the holes 140 in the base member 10 of conductive material (e.g., copper) may include laser drilling and etching, for example.

In the illustrated example, a further distribution of holes 120 is also produced surrounding the die attachment portion 12. The same features previously described for the holes 140 (e.g., opening at the front surface of the base member 10, through holes, diameter, pitch, technologies, etc.) may also apply to the holes 120.

Figure 3:
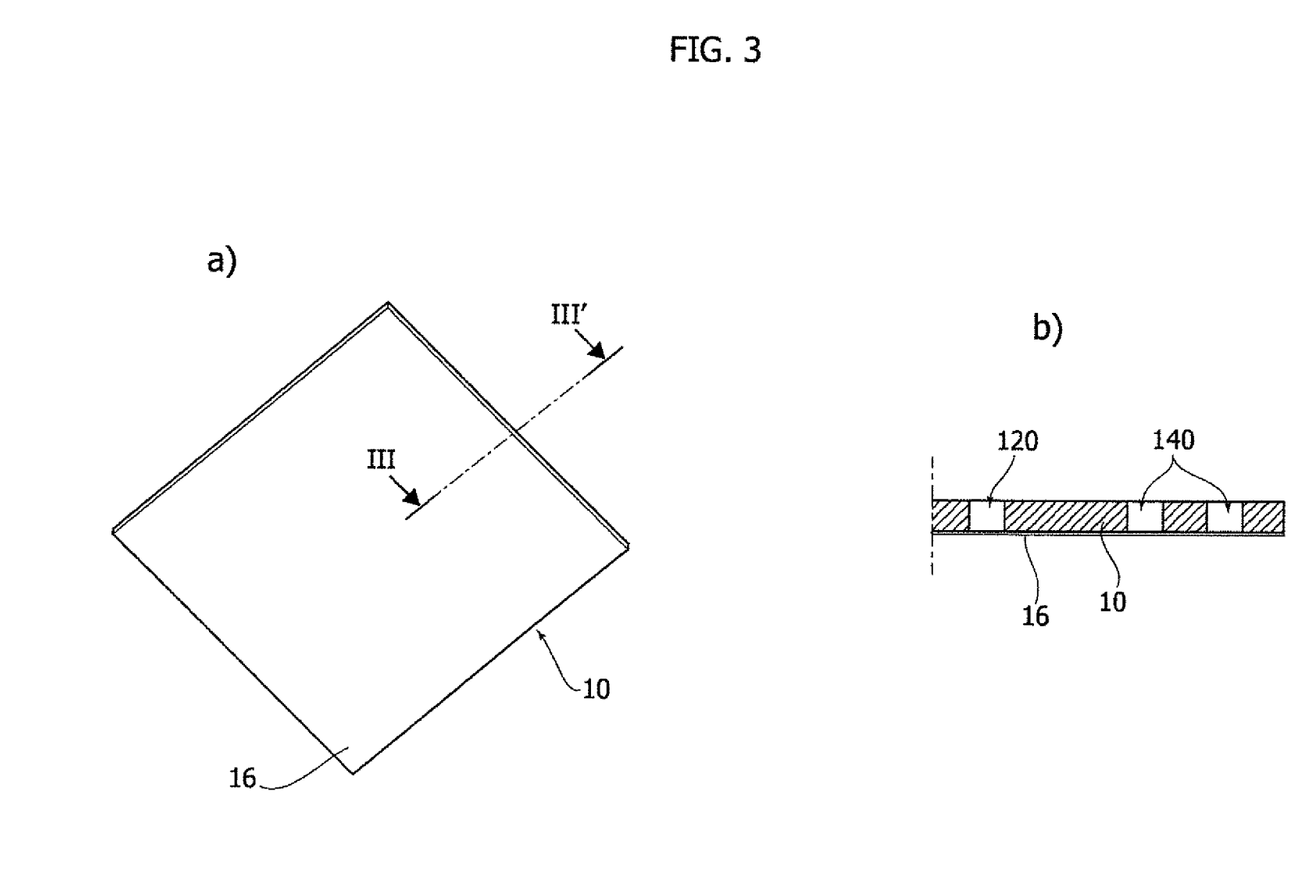

In FIG. 3, the base member 10 is seen from a viewpoint approximately opposed to the viewpoint of FIGS. 1 and 2, i.e., from the back surface, and illustrates an example application of a laminar material 16 applying onto the back surface of the base member 10, such as a lamination tape, for example. Once applied, the laminar material 16 renders the holes 140, 120 (originally produced as through holes) blind holes which are open at the front surface of the base member and closed at the back surface of the base member 10 by the laminar material 16. A material such as a heat resistant-low adhesion tape such as those marketed as 3M 5414, Hitachi RT 321 Thermoplastic, or Nitta Denko-TRM6250/36508 may be used for the laminar material 16, for example.

In one or more embodiments, the holes 140 and 120 may be produced from the beginning as blind holes (e.g., via controlled laser drilling or controlled etching) in such a way that those blind holes are open at the front surface and closed at the back surface of the base member 10. In such embodiments, applying the lamination material 16 (and subsequently removing it as described in the following) may be omitted, if desired.

Figure 4:
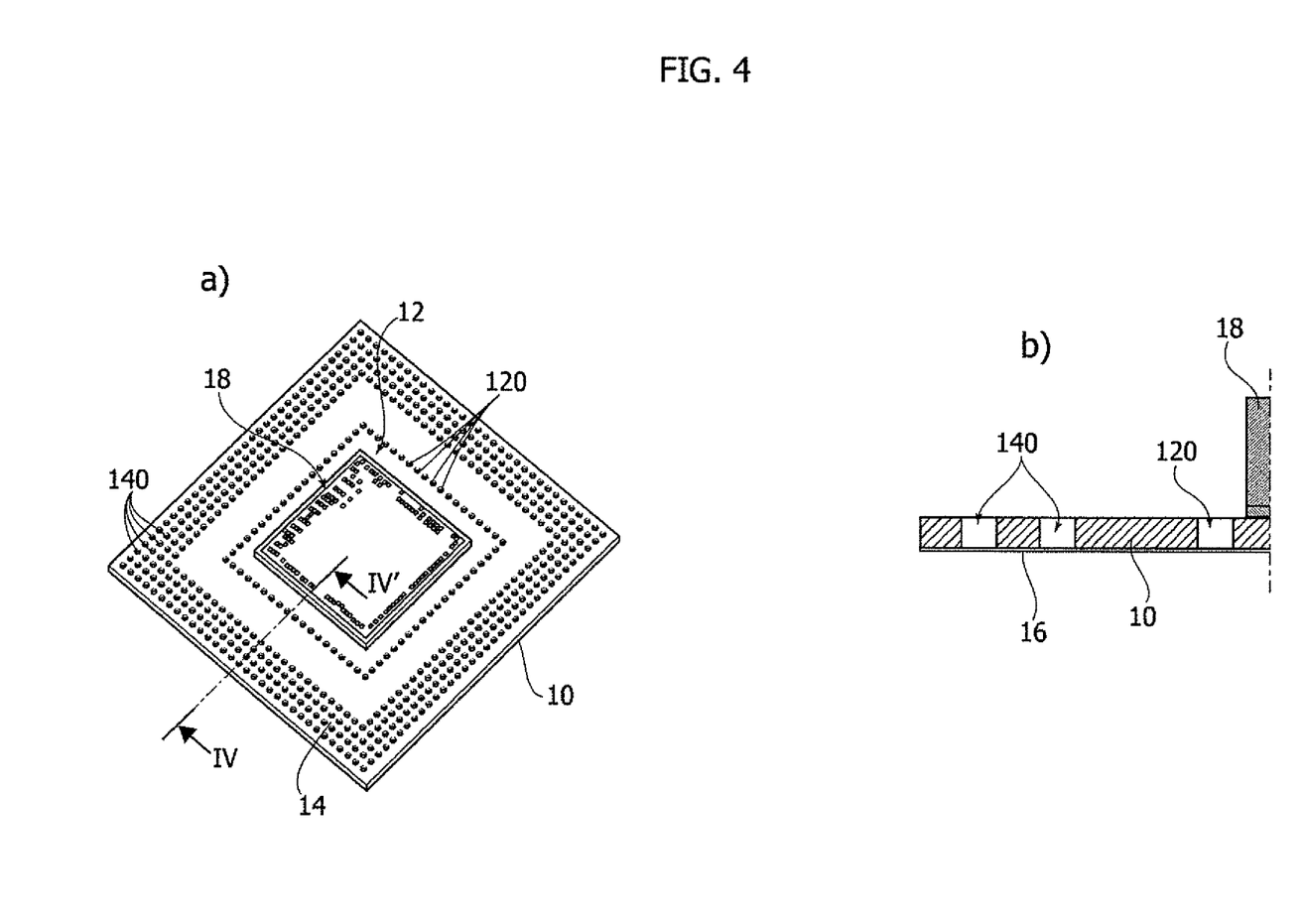

In FIG. 4, the base member 10 is again shown from the front surface, i.e., as in FIGS. 1 and 2. Here an integrated circuit (die) 18 is attached to the die attachment portion 12 at the front surface of the base member 10. Die attachment may be by performed using various known approaches for that purpose.

Figure 5:
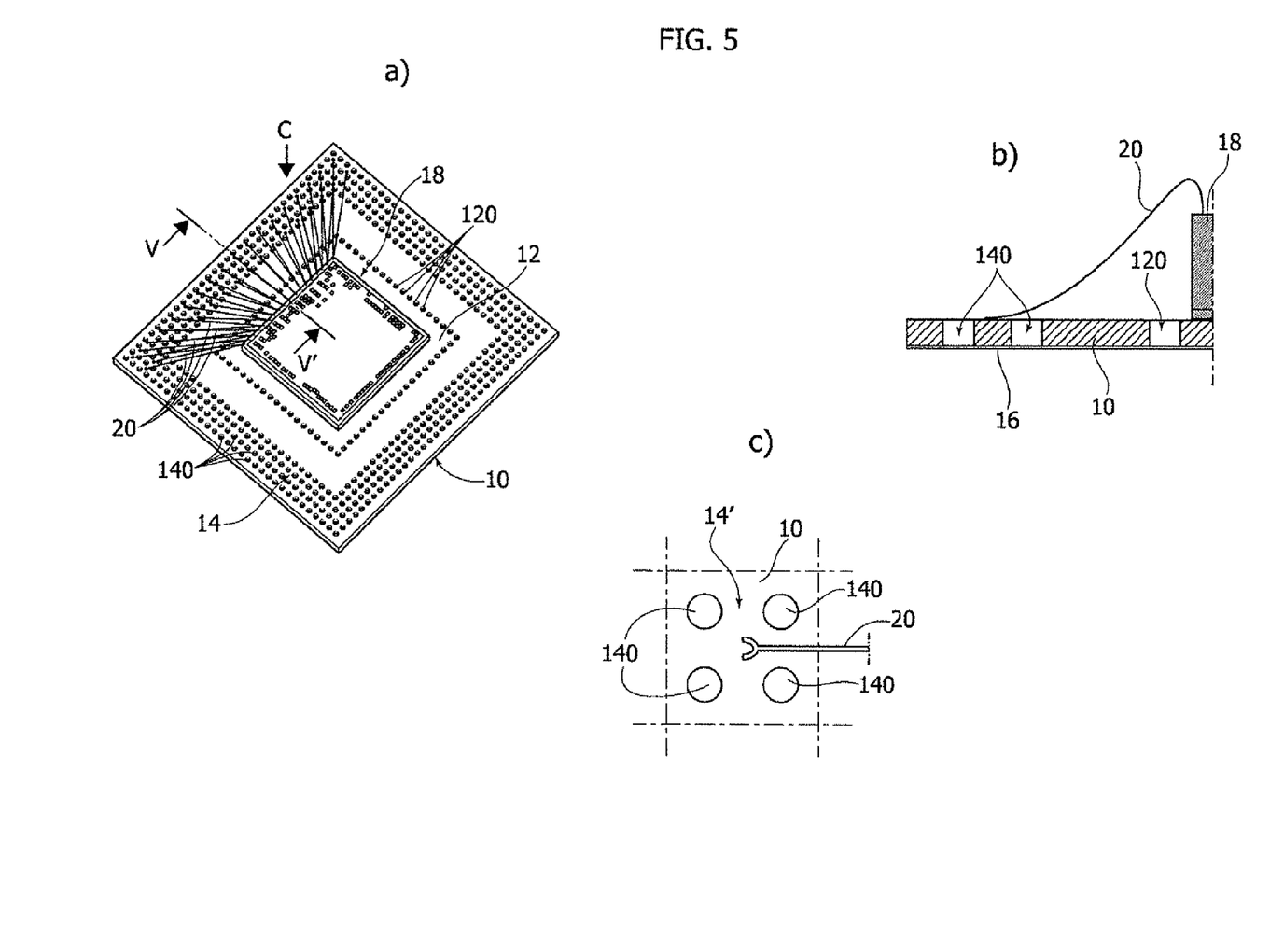

Furthermore, FIG. 5 illustrates an exemplary step where wire bonding is performed. This is done by connecting (e.g., by electrically conductive bonding wires 20, such as copper bonding wires) die pads as provided on the integrated circuit 18 with wire bonding locations 14' on the lead frame portion 14 at the front surface of the base member 10, as schematically represented in portion c) of FIG. 5. The wire bonding locations 14' may be located at spaces included between adjacent holes 140 as shown in some embodiments. Wire bonding technologies and materials are known in the art, and thus further description thereof is unnecessary herein.

Figure 6:
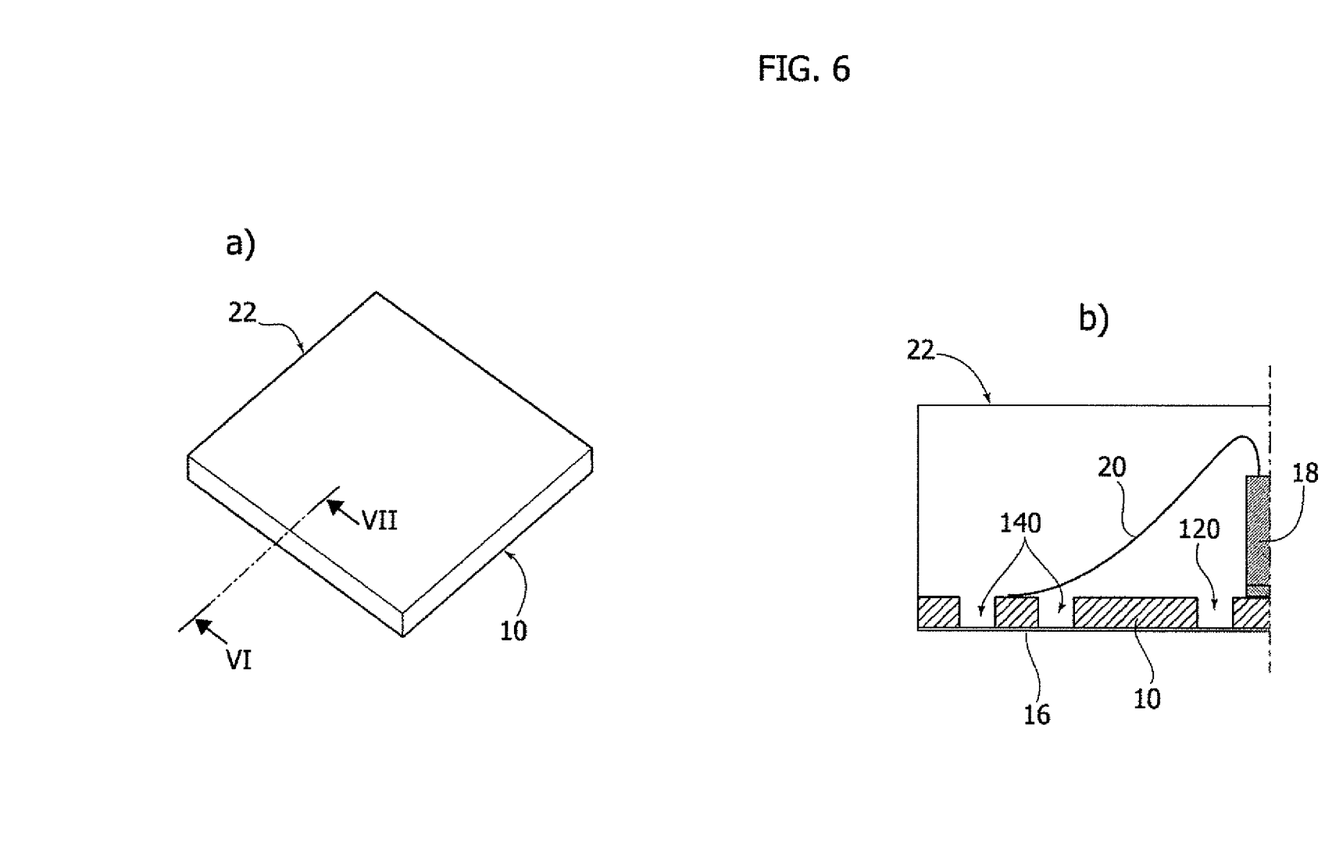

An exemplary step is illustrated in FIG. 6 wherein an electrically insulating package molding compound (PMC) 22 is molded onto the front surface of base member 10 and the integrated circuit 18 mounted thereon. This is done so that the integrated circuit 18 and wire bonding pattern 20 are embedded in the package molding compound 22.

A package molding compound 22 having mold filler dimensions (substantially) smaller than 100 µm may be used in an example embodiment. However, package molding technologies and materials are generally known in the art, and it is accordingly unnecessary to provide a more detailed description herein.

As seen in the cross-sectional view of portion b) of FIG. 6, when molded (in a flowable, e.g., molten state) onto the base member 10 the package molding compound has the capability of penetrating into the holes 140, 120—which are open at the front surface of the base member 10. This gives rise columnar formations of the package molding compound which extend into the holes 140, 120 (see, e.g. the formations 1400 and 1200 to be discussed later in connection with FIG. 12).

The package molding compound is otherwise prevented from exiting the holes 140, 120 at the back surface of the base member 10 due to the presence of the laminar material (i.e., lamination layer 16). In the alternative, the holes 140, 120 may instead be formed as blind holes closed at the back surface of the base member 10, as discussed above.

Figure 7:
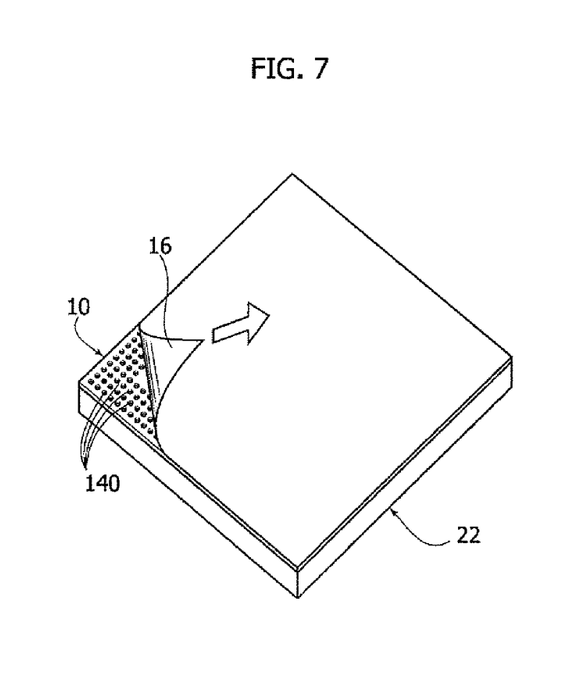
Figure 8:
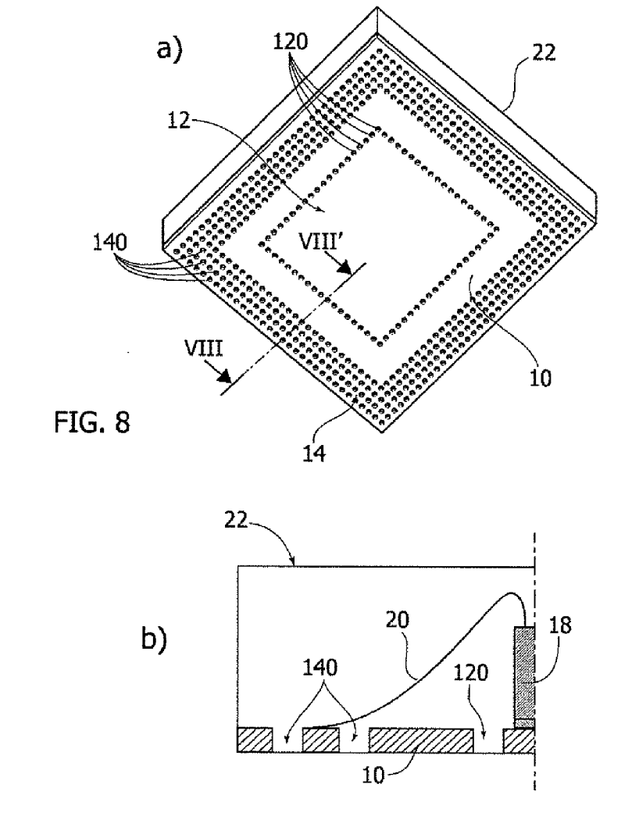

FIG. 7 illustrates removing (e.g., peeling off) the laminar material 16 from the back surface of the base member 10 so that the columnar formations produced by the package molding compound 20 at the holes 120 and 140 become exposed at the back surface of the base member 10, as seen in FIG. 8. It will be appreciated that in portion a) of FIG. 8 the base member 10 is again seen from the back surface with the "distal" ends of the columnar formations produced by the package molding compound 22 visible through the open ends of the holes 140 and 120.

Figure 9:
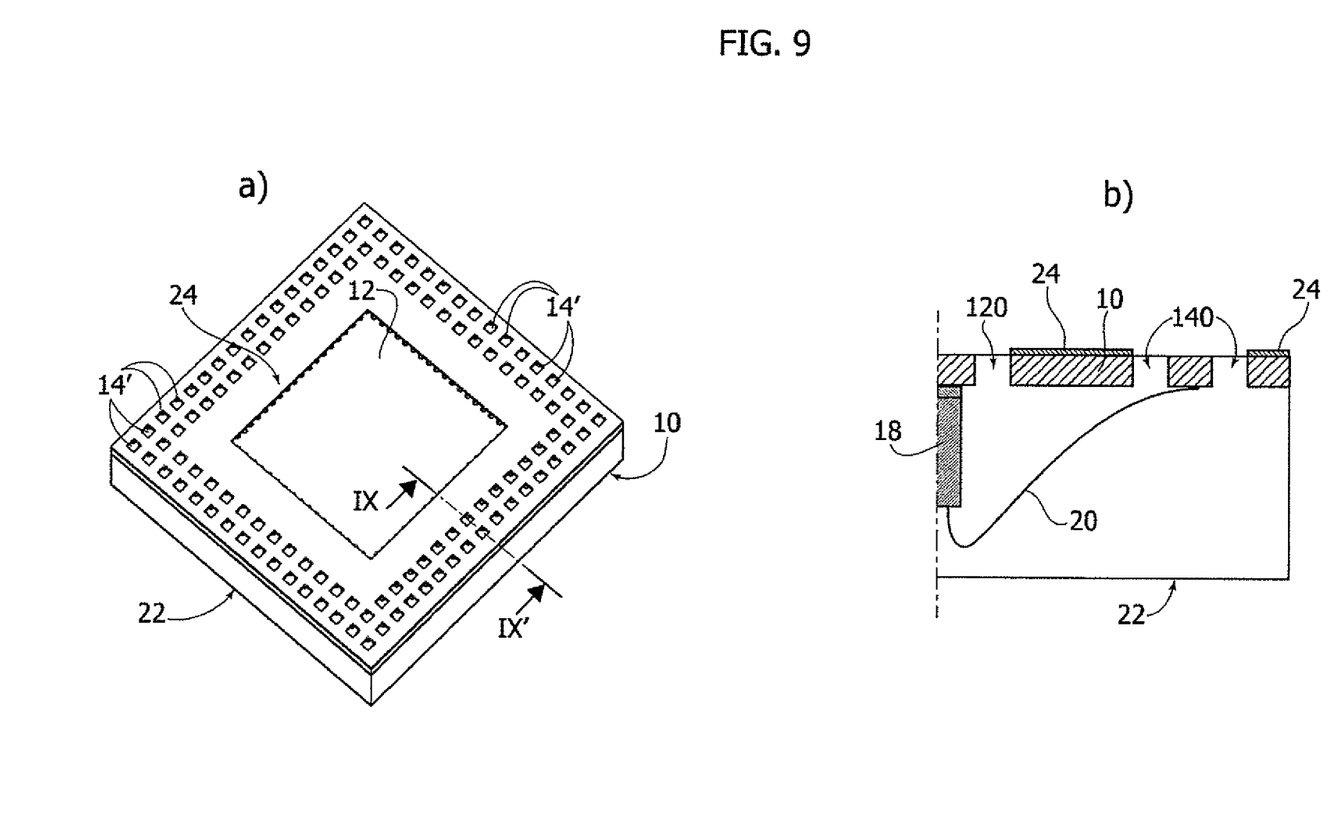

In FIG. 9, the back surface of the base member 10 layer is again visible with the die attachment portion 12 exposed. A masking layer 24 (e.g., paraffin wax) may be selectively applied (by known technologies such as jet dispense or screen printing, for example). In an example embodiment, the masking layer 24 may be applied in such a way as to also leave uncovered, in addition to the die attachment portion 12, those locations 14' of the lead frame portion 14 corresponding to locations where the wires 20 of the wire bonding pattern have been attached to (the front surface of) the base member 10 in a step as exemplified in FIG. 5. As illustrated, any such location 14' may be arranged in a portion of the base member 10 surrounded by a set of holes 140.

Figure 10:
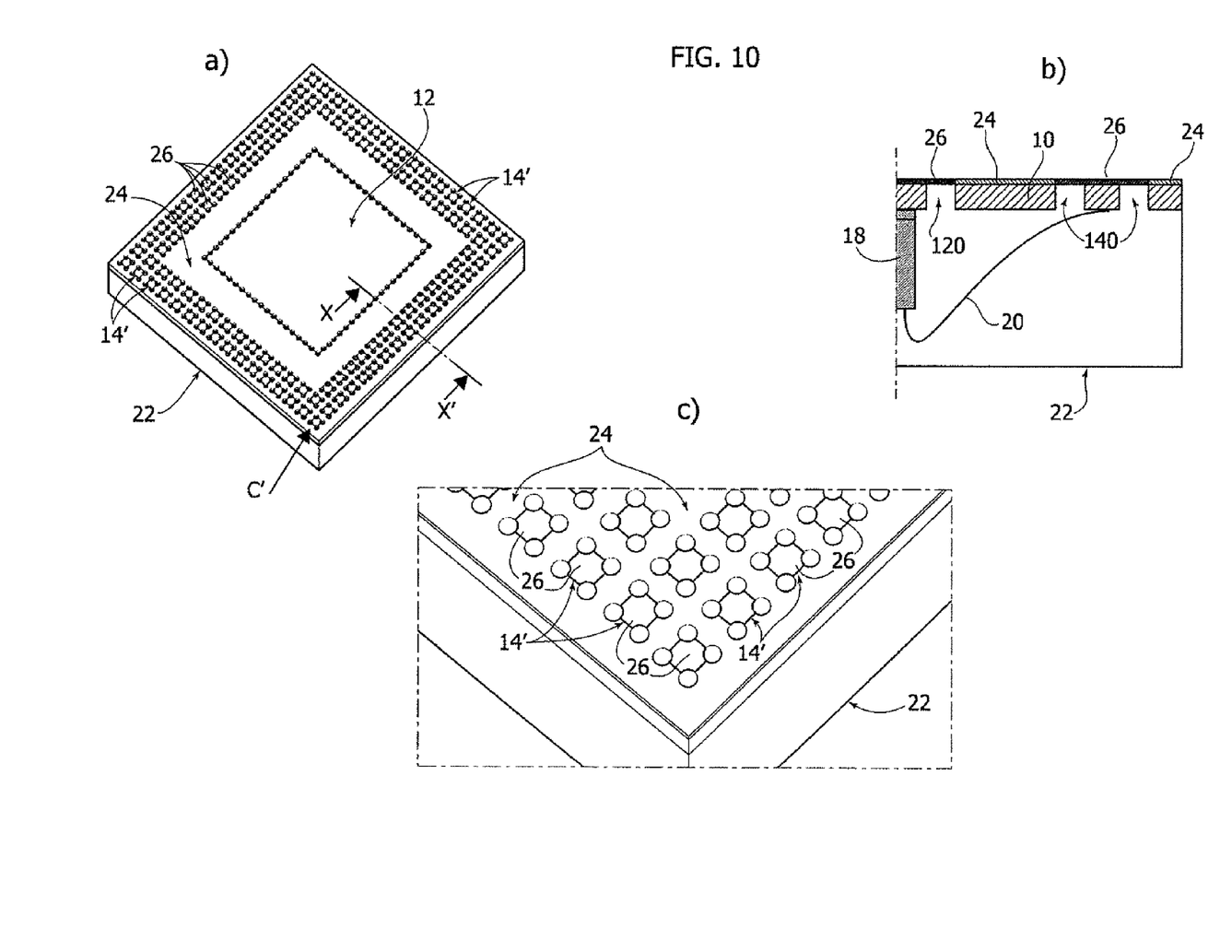

FIG. 10 illustrates a step of applying a metallization (e.g., electro plating with electrically conductive material such as Ni, Au, Pd) to those portions which were left uncovered by the protective mask 24. The electrically conductive layer thus produced is denoted 26 in FIG. 10. As shown in portion c) of FIG. 10, at the lead frame portion 14, the electrically conductive (e.g. electro-plated) layer 26 may cover the "islands" 14' corresponding to the wire bonding locations (see e.g. portion c) of FIG. 5.

In one example embodiment, applying the electrically conductive layer 26 may thus include: applying the masking material 24 to certain portions of the back surface of the base member 10 intended to be etched as discussed below; applying (e.g. by electro plating, with the masking material 24 being compatible with the plating baths) the electrically conductive layer 26 to those portions of the back surface of the base member left uncovered by the masking material 24; and removing the masking material 24.

Figure 11:
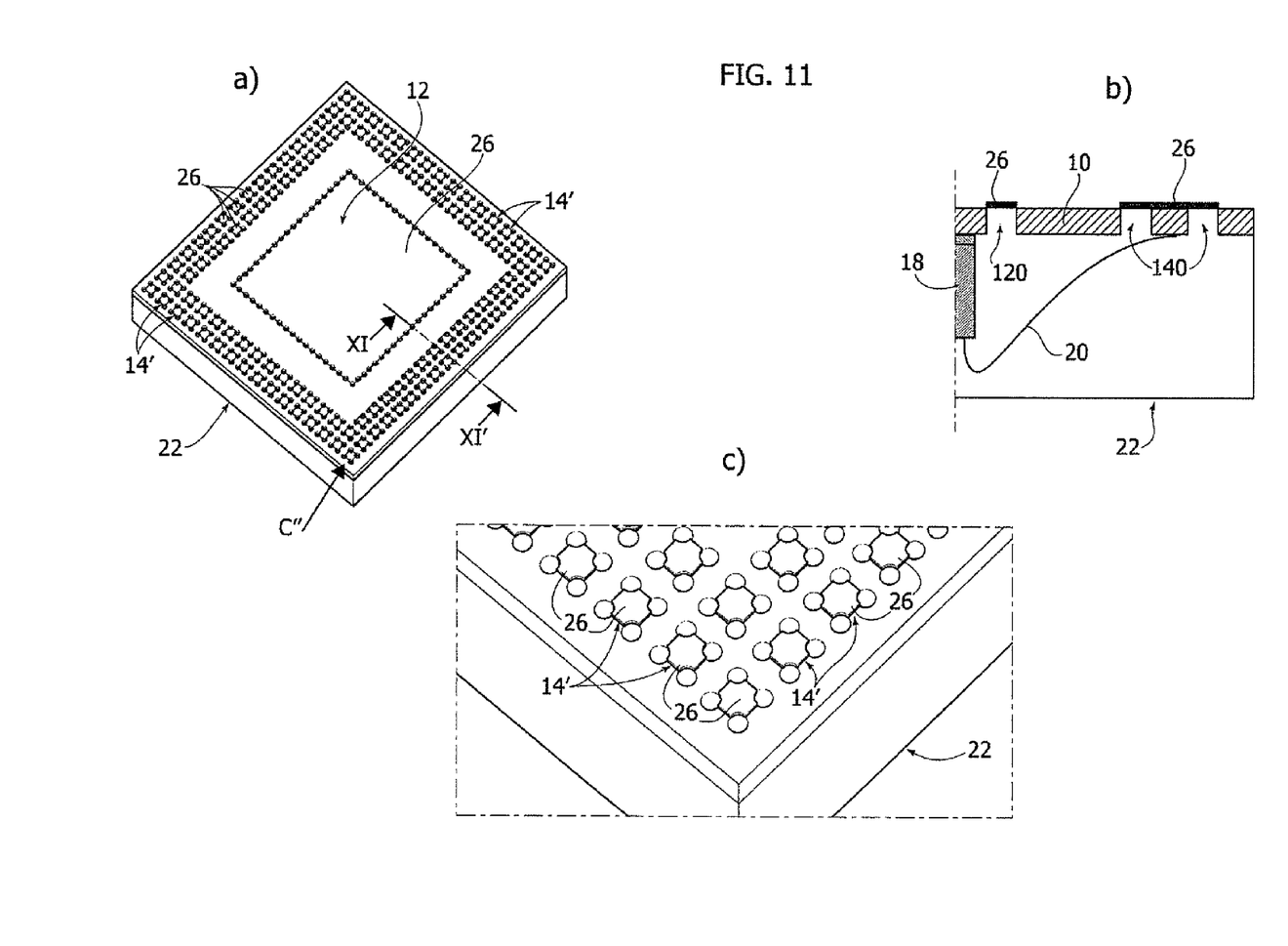

In an example embodiment, once the masking layer 24 is removed (as schematically shown in FIG. 11, and in particular portion b) thereof), an etching treatment (which may be of a known type) may be applied to the back surface of the base member 10. This may be done in such a way that the electrically conductive material (e.g., copper) of the base member is removed in those areas where the base member 10 is not covered by the electrical conductive (e.g. electro-plated) layer 26. The electrically conductive base member 10 may then be left in place (only) at those location 14' corresponding to the wire bonding locations with each location including an electrically-conductive pin.

In an example embodiment, such a pin may include: a "proximal" portion including an un-etched portion of the base member 10, which may be electrically connected to a wire 20 in the wire bonding pattern; and a "distal" portion 26 including the material 26 (e.g., electro plated) with such a pin included (and retained) between a set of columnar portions 1400 (e.g., four) formed by the package molding compound material 22 which has penetrated into the holes 140.

Figure 12:
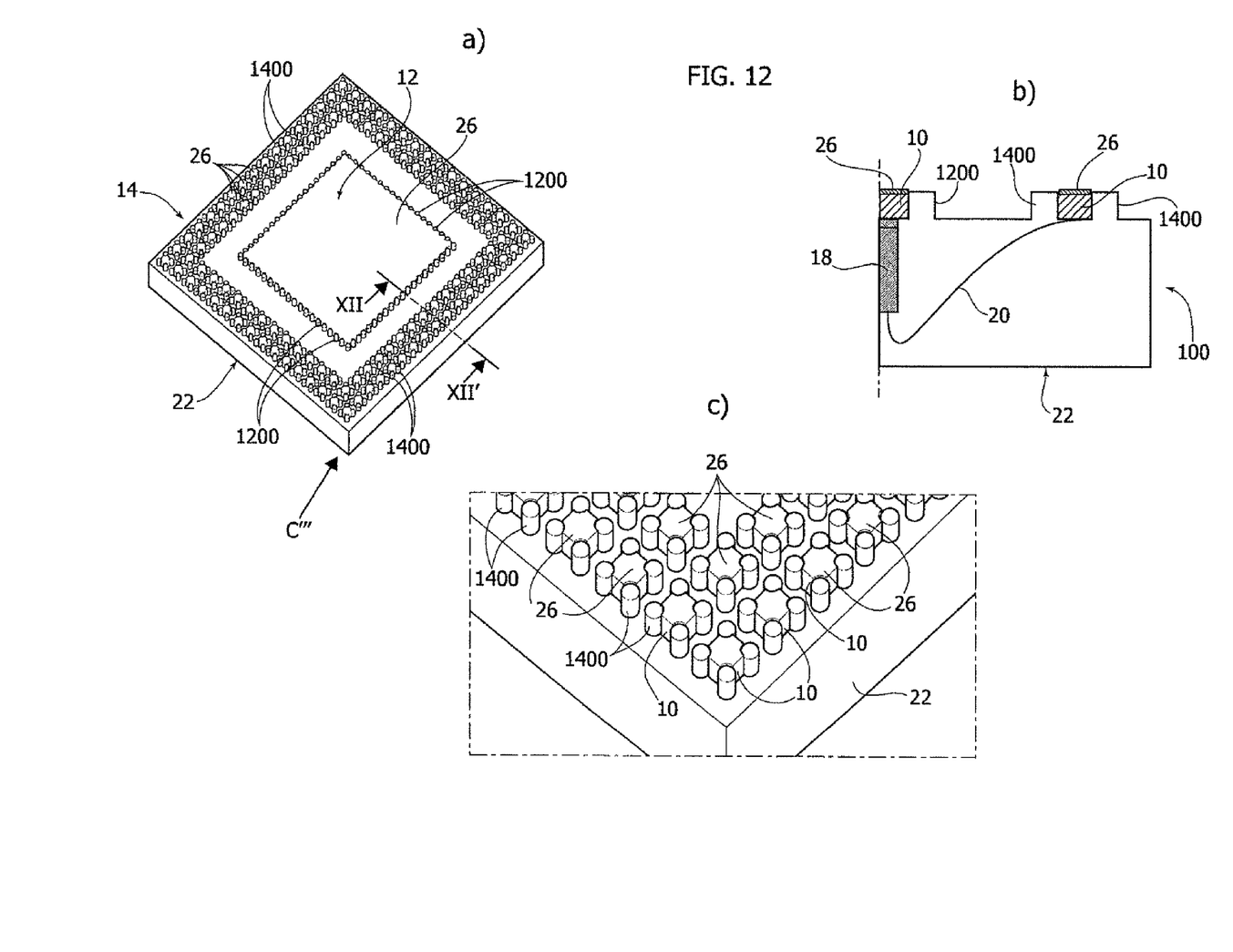

A similar "crown" of columnar formations 1200 formed by the package molding compound penetrating into the holes 120 may correspondingly retain the electro-plated material 26 at the die attachment portion 12 to form a thermal contact pad for the integrated circuit 18. In one or more embodiments, such a thermal pad may facilitate heat transfer towards the substrate (e.g., a PCB, which is not visible in the figures), onto which the final resulting component 100 as shown in FIG. 12 may be mounted.

It may be possible to produce a low-cost lead frame out of the base member sheet (e.g., copper) 10 with the holes 140 provided therein. Lead frames may thus be easily produced (e.g., by laser drilling), which may facilitate rapid and low cost prototyping.

In one or more embodiments, columnar formations such as the columnar formations 1200, 1400 of plastic material, for example, such as a package molding compound, may also offer improved SMT soldering control with such columnar formations being located close to the contacts.

In one or more embodiments, selecting a value of SA roughness of 1.6-1.8 for the base member may be beneficial in facilitating wire bondability.

As indicated, in an example embodiment, applying (and subsequently removing) the laminar material 16 may be dispensed with by producing the holes 140 (and 120) as blind holes leaving, for example, a thickness of 20+/−5 µm as a lid closing the holes at the back surface of the base member 10, which may be subsequently removed by back etching.

Furthermore, materials other that paraffin wax may be used as a masking material 24. Materials such as a resist or water soluble masks are examples of such alternative materials.

Without prejudice to the underlying principles, the details and embodiments may vary, even significantly, with respect to what has been disclosed by way of example only, and as further defined by the annexed claims.

The invention claimed is:

1. A method of making an integrated circuit comprising:
   providing an electrically conductive base member comprising opposing front and back surfaces, the base member comprising a die attachment portion and a lead frame portion;
   forming, at the lead frame portion of the base member, a set of holes opening at the front surface of the base member, the front surface of the base member at the lead frame portion comprising wire bonding locations, a subset of the set of holes being formed around each of the wire bonding locations;
   attaching an integrated circuit to the front surface of the base member at the die attachment portion;
   forming wire bonds between the integrated circuit and the wire bonding locations;
   molding an electrically insulating package molding compound onto the front surface of the base member so that the integrated circuit and the wire bonds are embedded in the package molding compound with the package molding compound penetrating into the set of holes opening at the front surface of the base member, the package molding compound comprising a first major surface covering the integrated circuit and an opposite second major surface under the integrated circuit; and
   selectively etching the base member from the back surface thereof to define residual portions of the base member at the wire bonding locations, the residual portions being surrounded by columnar formations of the package molding compound which penetrate into the set of holes, wherein the columnar formations and the residual portions under the wire bonding locations protrude away from the second major surface of the package molding compound.

2. The method of claim 1, wherein the electrically conductive base member comprises an electrically conductive laminar base member.

3. The method of claim 1, further comprising forming an additional set of holes surrounding the die attachment portion and opening at the front surface of the base member; and wherein selectively etching comprises not etching the base member from the back surface of the base member at the die attachment portion to provide a thermal pad in the die attachment portion surrounded by respective columnar formations of the package molding compound which penetrate into the additional set of holes.

4. The method of claim 1, further comprising applying an electrically conductive layer at the residual portions.

5. The method of claim 4, wherein applying further comprises:
   applying a masking material to portions of the back surface of the base member to be etched;
   applying the electrically conductive layer at portions of the back surface left uncovered by the masking material; and
   removing the masking material from the portions of the back surface of the base member prior to selectively etching the base member from the back surface thereof.

6. The method of claim 5, wherein the masking material comprises at least one of a wax, a paraffin wax, an etch resist, and a water soluble mask.

7. The method of claim 1, wherein forming the set of holes comprises forming the set of holes extending through the base member from the front surface to the back surface; and further comprising:
   applying a laminar material on the back surface of the base member so that the set of holes is open at the front surface and closed by the laminar material at the back surface of the base member; and
   removing the laminar material after molding the package molding compound onto the front surface of the base member.

8. The method of claim 1, wherein forming the set of holes comprises forming the set of holes to be open at the front surface of the base member and closed at the back surface of the base member.

9. The method of claim 1, wherein forming the set of holes comprises forming the set of holes by at least one of laser drilling and etching.

10. The method of claim 1, wherein the base member comprises at least one of copper and aluminum.

11. A method of making an integrated circuit comprising:
    providing an electrically conductive laminar base member comprising opposing front and back surfaces, the base member comprising a die attachment portion and a lead frame portion;
    forming, at the lead frame portion of the base member, a first set of holes opening at the front surface of the base member;
    forming a second set of holes surrounding the die attachment portion and opening at the front surface of the base member;
    attaching an integrated circuit to the front surface of the base member at the die attachment portion;
    forming wire bonds between the integrated circuit and wire bonding locations on the front surface of the base member at the lead frame portion;

molding an electrically insulating package molding compound onto the front surface of the base member so that the integrated circuit and the wire bonds are embedded in the package molding compound with the package molding compound penetrating into the first and second sets of holes opening at the front surface of the base member; and selectively etching the base member from the back surface thereof to define residual portions of the base member at the wire bonding locations, the residual portions being surrounded by columnar formations of the package molding compound penetrating into the first set of holes, the selective etching providing a thermal pad in the die attachment portion surrounded by respective columnar formations of the package molding compound that penetrated into the second set of holes, wherein the columnar formations of the package molding compound that penetrated into the first and the second set of holes protrude out from a major surface of the package molding compound.

12. The method of claim 11, further comprising applying an electrically conductive layer at the residual portions.

13. The method of claim 12, wherein applying further comprises:

applying a masking material to portions of the back surface of the base member to be etched;

applying the electrically conductive layer at portions of the back surface left uncovered by the masking material; and removing the masking material from the portions of the back surface of the base member prior to selectively etching the base member from the back surface thereof.

14. The method of claim 11, wherein forming the first and second sets of holes comprises forming the first and second sets of holes extending through the base member from the front surface to the back surface; and further comprising:

applying a laminar material on the back surface of the base member so that the first and second sets of holes are open at the front surface and closed by the laminar material at the back surface of the base member; and removing the laminar material after molding the package molding compound onto the front surface of the base member.

15. An integrated circuit comprising:

an electrically conductive base member comprising opposing front and back surfaces, the base member comprising a die attachment portion and a lead frame portion comprising external contacts;

an integrated circuit coupled to said die attachment portion;

wire bonds extending between the integrated circuit and wire bonding locations at an inner surface of the external contacts of the lead frame portion of the base member; and an electrically insulating molding compound in which said integrated circuit and said wire bonds are embedded, wherein the electrically insulating molding compound comprises a major surface, wherein the external contacts at the lead frame portion are each supported by a first plurality of pillars comprising the electrically insulating molding compound, wherein the external contacts and the first plurality of pillars protrude from the major surface of the electrically insulating molding compound.

16. The integrated circuit of claim 15, wherein said electrically conductive base member comprises an electrically conductive laminar base member.

17. The integrated circuit of claim 15, further comprising a second plurality of pillars protruding from the major surface, wherein said base member further comprises a thermal pad at the die attachment portion on the back surface of the base member; and wherein the second plurality of pillars are disposed around the thermal pad at the die attachment portion.

18. The integrated circuit of claim 15, further comprising an electrically conductive layer over an outer surface of the external contacts of the lead frame portions.

19. The integrated circuit of claim 15, wherein said base member comprises at least one of copper and aluminum.

20. A method of making an integrated circuit comprising:

providing an electrically conductive base member comprising opposing front and back surfaces, the base member comprising a die attachment portion and a lead frame portion;

forming, at the lead frame portion of the base member, a set of holes opening at the front surface of the base member, the front surface of the base member at the lead frame portion comprising wire bonding locations, a subset of the set of holes being formed around each of the wire bonding locations;

attaching an integrated circuit to the front surface of the base member at the die attachment portion;

forming wire bonds between the integrated circuit and the wire bonding locations;

encapsulating the integrated circuit and the wire bonds in a package molding compound, the package molding compound filling the set of holes opening at the front surface of the base member;

applying an electrically conductive layer at portions of the back surface, the electrically conductive layer covering the lead frame portion directly under the wire bonding portions and the set of holes filled with the package molding compound; and using the electrically conductive layer as a etch mask, selectively etching the base member from the back surface to define residual portions of the base member at the wire bonding locations, the residual portions being surrounded by columnar formations of the package molding compound which penetrate into the set of holes.

21. The method of claim 20, further comprising:

applying a masking material to portions of the back surface of the base member to be selectively etched, wherein the electrically conductive layer is applied to regions uncovered with the masking material; and removing the masking material from the portions of the back surface of the base member prior to selectively etching the base member from the back surface.

22. The method of claim 20, further comprising forming an additional set of holes surrounding the die attachment portion and opening at the front surface of the base member; and wherein selectively etching comprises not etching the base member from the back surface of the base member at the die attachment portion to provide a thermal pad in the die attachment portion surrounded by respective columnar formations of the package molding compound which penetrate into the additional set of holes.

* * * * *